(12) United States Patent
Lee et al.

(10) Patent No.: US 11,675,046 B2
(45) Date of Patent: Jun. 13, 2023

(54) TRANSMITTER UNIT SUITABLE FOR MILLIMETER WAVE DEVICES

(71) Applicant: GLOBALFOUNDRIES INC., Grand Cayman (KY)

(72) Inventors: See Taur Lee, Allen, TX (US); Sher Jiung Fang, Allen, TX (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 921 days.

(21) Appl. No.: 16/558,095

(22) Filed: Aug. 31, 2019

(65) Prior Publication Data
US 2021/0063531 A1 Mar. 4, 2021

(51) Int. Cl.
| | |
|---|---|
| *G01S 7/35* | (2006.01) |
| *H03K 5/00* | (2006.01) |
| *H03F 3/24* | (2006.01) |
| *G01S 7/282* | (2006.01) |

(52) U.S. Cl.
CPC ............... *G01S 7/35* (2013.01); *G01S 7/282* (2013.01); *H03F 3/245* (2013.01); *H03K 5/00006* (2013.01); *H03F 2200/451* (2013.01)

(58) Field of Classification Search
CPC . G01S 7/35; G01S 7/282; H03F 3/245; H03F 2200/451; H03K 5/00006
See application file for complete search history.

(56) References Cited

U.S. PATENT DOCUMENTS

| | | | | |
|---|---|---|---|---|
| 8,085,100 | B2* | 12/2011 | Brennan | G06F 7/68 |
| | | | | 333/172 |
| 10,797,647 | B1* | 10/2020 | Mokhtari | H03D 7/1441 |
| 2003/0179131 | A1 | 9/2003 | Brosche | |

OTHER PUBLICATIONS

Trotta, et al.; "A 79GHz SiGe-Bipolar Spread-Spectrum TX for Automotive Radar"2007 IEEE International Solid-State Circuits Conference; Section 23; Broadband RF and Radar / 23.7.
Ng, Herman Jalli; A Fully-Integrated 77 GHz UWB Psudo-Random Noise Radar TRansceiver with a Programmable Sequence Generator in SiGe Technology; IEEE Transactions on Circuits and Systems; I:Regular Papers, vol. 61, No. 8, Aug. 2014.
A 79GHz Binary Phase-Modulated Continuous-Wave Radar Transceiver with TX-to-RX Spillover Cancellation in 28nm CMOS; ISSCC 2015; Session 19; Advanced Wireless Techniques 19.7.

* cited by examiner

*Primary Examiner* — Metasebia T Retebo
(74) *Attorney, Agent, or Firm* — David Cain

(57) ABSTRACT

Transmitters having increased efficiency, such as may be useful in millimeter-wave devices. A semiconductor device, comprising a transmitter, comprising a modulator configured to receive a differential input signal having a first frequency and provide a differential modulated signal having the first frequency and a first clock phase; a series comprising one or more frequency multipliers, wherein the series of frequency multipliers is configured to receive the differential modulated signal and provide a differential second signal having a second frequency greater than the first frequency and having a second clock phase; and an output transformer configured to receive the differential second signal and transform the differential second signal to a single-ended output signal. Methods of using such transmitters. Systems for manufacturing devices comprising such transmitters.

18 Claims, 12 Drawing Sheets

TRANSMITTER UNIT SUITABLE FOR MILLIMETER WAVE DEVICES

BACKGROUND OF THE INVENTION

Field of the Invention

Generally, the present disclosure relates to sophisticated semiconductor devices, and, more specifically, to transmitter units suitable for millimeter wave devices.

Description of the Related Art

There have been many advances in devices that use millimeter wave (mm-wave) signals. Semiconductor devices that involve mm-wave applications include devices that operate based on the electromagnetic spectrum of radio band frequencies in the range of about 30 Gigahertz (GHz) to about 300 GHz. The mm-wave radio waves have a wavelength in the range of 1 millimeter (mm) to about 10 mm. This band of frequencies is sometimes referred to as extremely high frequency (EHF) frequency band range. Examples of applications of mm-wave application include radar devices, high-speed communication devices (e.g., wireless gigabit (WiGig) devices), etc. Radar devices have been implemented in various applications such as vehicle safety and automation applications.

Implementing mm-wave applications produces many challenges when designing circuits for these applications. For example, frequency-modulated continuous wave (FMCW) transmitters in millimeter wave devices, such as vehicular radar devices, 5G telecommunication devices, and the like, may suffer from inefficiencies in output power.

It would be desirable to have a FMCW transmitter that may have improved efficiency.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

In one embodiment, the present disclosure is directed to a semiconductor device, comprising a transmitter, comprising a modulator configured to receive a differential input signal having a first frequency and provide a differential modulated signal having the first frequency and a first clock phase; a series comprising one or more frequency multipliers, wherein the series of frequency multipliers is configured to receive the differential modulated signal and provide a differential second signal having a second frequency greater than the first frequency and having a second clock phase; and an output transformer configured to receive the differential second signal and transform the differential second signal to a single-ended output signal.

In one embodiment, the present disclosure is directed to a method, comprising receiving a differential input signal having a first frequency; providing a differential modulated signal having the first frequency and a first clock phase; multiplying the differential modulated signal to yield a differential second signal having a second frequency greater than the first frequency and having a second clock phase; transforming the differential second signal to a single-ended output signal; and transmitting the single-ended output signal.

In one embodiment, the present disclosure is directed to a manufacturing system, configured to manufacture a semiconductor device, such as the semiconductor device referred to above.

Embodiments herein may provide mm-wave transmitter units with improved efficiency.

BRIEF DESCRIPTION OF THE DRAWINGS

The disclosure may be understood by reference to the following description taken in conjunction with the accompanying drawings, in which like reference numerals identify like elements, and in which.

Figure 1:
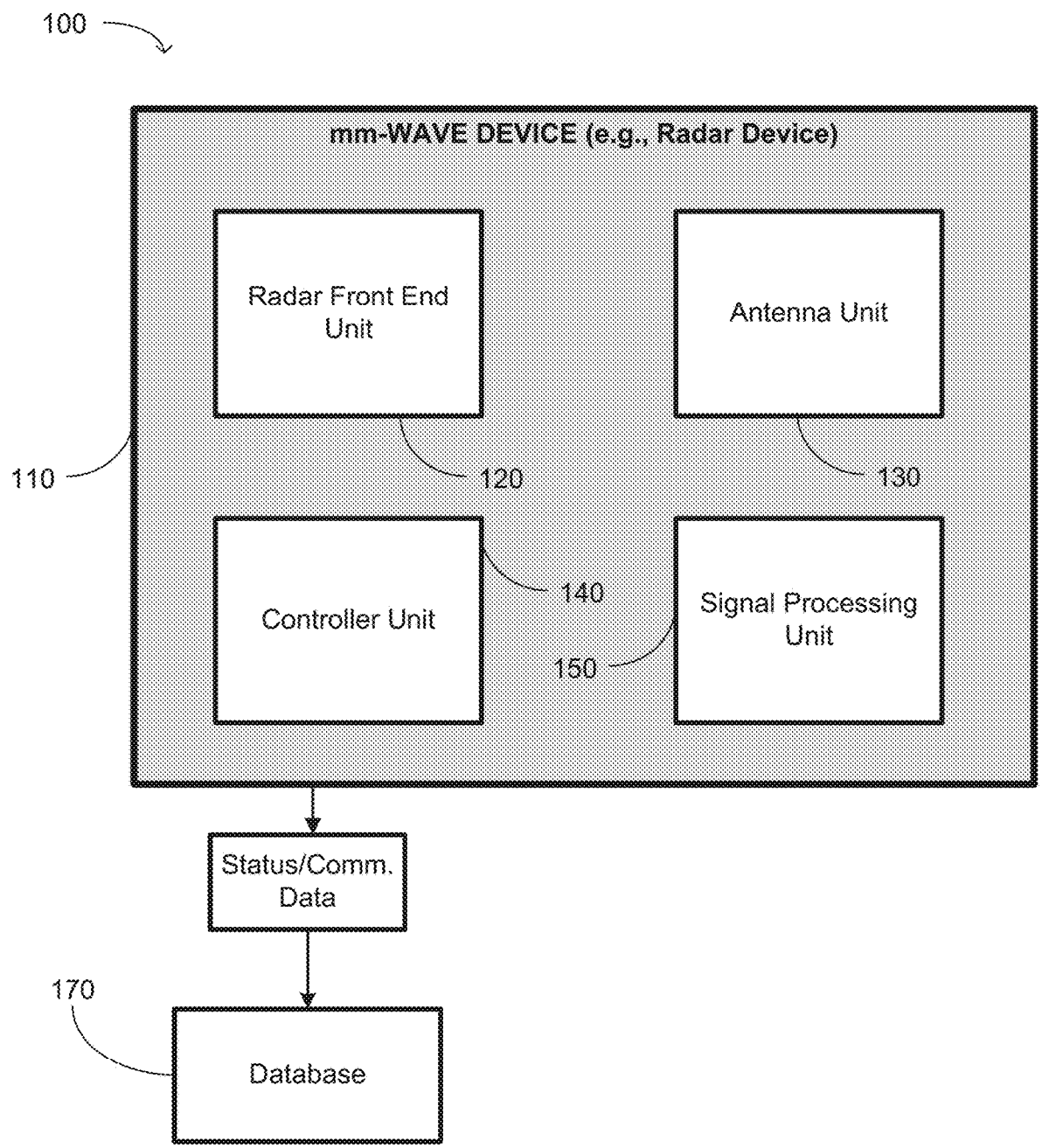
FIG. 1 illustrates a stylized block diagram representation of a mm-wave radar system, in accordance with embodiments herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims. Moreover, the stylized depictions illustrated in the drawings are not drawn to any absolute scale.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems, and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein provide for mm-wave transmitters with improved efficiency. Embodiments herein provide binary phase-shift keying (BPSK) modulators disposed early in the transmit chain and operating on signals with lower frequency than the final, transmitted frequency. The transistor devices described in embodiments herein may be formed using a fully-depleted silicon-on-insulator (FDSOI) process.

For ease of illustration, embodiments herein is depicted within the context of a radar device, however, those skilled in the art would readily appreciate that the concepts disclosed herein may be implemented in other types of devices, such as radar devices, network devices, high-definition video devices, etc. Turning now to FIG. 1, a stylized block diagram representation of an mm-wave system, in accordance with embodiments herein, is illustrated.

A system 100 may comprise an mm-wave device 110 and a database 170. The mm-wave device 110 may be a radar device or alternatively, a wireless communication device, a data network device, a video device, or the like. For illustrative purposes and for the sake of clarity and ease of description, the mm-wave device 110 is described in the context of a radar application; as such, the mm-wave device 110 may also be referred to below as a radar device 110. However, those skilled in the art having benefit of the present disclosure would appreciate that the concepts described herein may be applied to a variety of type of mm-wave applications, including wireless network applications, data network applications, video and audio applications, etc.

The radar device 110 is capable of transmitting a first radar signal, receiving a second radar signal, and processing the second radar signal.

The mm-wave device 110 may comprise a radar unit front end unit 120, an antenna unit 130, a controller unit 140, and a signal processing unit 150. The radar front end unit 120 may comprise a plurality of components, circuit, and/or modules, and is capable of sending, receiving, and processing radar signals. In one embodiment, the mm-wave device 110 may be encompassed into a single integrated circuit (IC) chip. In some embodiments, the mm-wave device 110 may be formed on a plurality of integrated circuits that are positioned on a single IC chip. In other embodiments, mm-wave device 110 may be formed on single integrated circuit, which is shrouded into an IC chip.

The radar front end unit 120 is capable of providing an output signal, e.g., a first radar signal. In one embodiment, the frequency range of the radar signals processed by the mm-wave device 110 may be in the range of about 10 GHz to about 90 GHz. A more detailed description of the radar front end unit 120 is provided in FIG. 3 and accompanying description below.

Continuing referring to FIG. 1, the antenna unit 130 may also comprise a transmission antenna and/or a receiver antenna. Further, each of the transmission and receiver antennas may comprise sub-portions to form an array of antennas. The transmission antennas are used for transmitting the first radar signal, while the receiver antennas are used for receiving the second radar signal. A more detailed description of the antenna unit 130 is provided in FIG. 7, and accompanying description below.

Continuing referring to FIG. 1, the mm-wave device 110 may also comprise a signal processing unit 150. The signal processing unit is capable of performing various analog and/or digital processing of the signals that are transmitted and/or received by the mm-wave device 110. For example, the first radar signal transmitted by the mm-wave device 110 may be amplified prior to its transmission. Further, the second radar signal received by the mm-wave device 110 may be sent through one or more analog filter stages. The received radar signals may then be converted to a digital signal by one or more analog-to-digital converters (ADC) in the signal processing unit 150. Digital signal processing (DSP) may be performed on the digitized signal. A more detailed description of the signal processing unit 150 is provided in FIG. 6 and accompanying description below.

Continuing referring to FIG. 1, the mm-wave device 110 may also comprise a controller unit 140. The controller unit 140 may perform various control operations of the mm-wave device 110. These functions include generating a radar signal, transmitting the radar signal, receiving an incoming radar signal, and processing the incoming radar signal.

Figure 2:
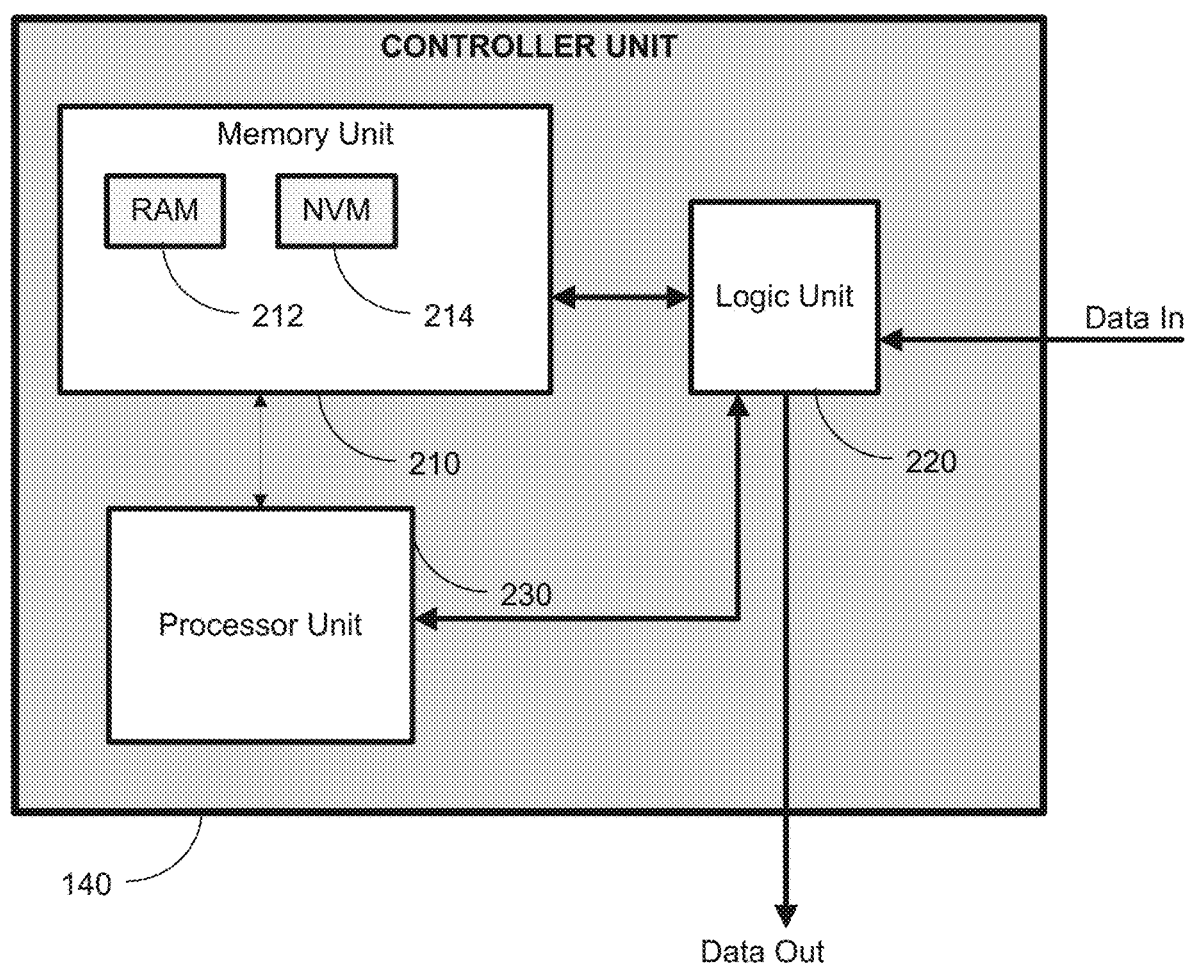
FIG. 2 illustrates a stylized block diagram description of the controller unit 140, in accordance with embodiments herein.

Turning now to FIG. 2, a stylized block diagram description of the controller unit 140, in accordance with embodiments herein, is provided. The controller unit 140 may comprise a processor unit 230 capable of controlling various function of the device 110. The processor unit 230 may comprise a microprocessor, a microcontroller, a field programmable gate array (FPGA), an application-specific integrated circuit (ASIC), and/or the like.

The controller unit 140 may also comprise a logic unit 220. The logic unit 220 may comprise a circuit that is capable of performing various logic operations, receiving data, and/or performing interface functions with respect to input data (data_in) and output data (data_out). The signal data_in may represent data derived from processing and analyzing a received radar signal. The data_out signal may represent data generated for a transmitted radar signal.

The controller unit 140 may also comprise a memory unit 210. The memory unit 210 may comprise a non-volatile memory 214 and a RAM 212. The non-volatile memory 214 may comprise FLASH memory and/or programmable read only (PROM) devices. The memory unit 210 is capable of storing operation parameters for controlling operations of the device 110. The memory unit 210 may also store data that may be used to program any FPGA devices in the mm-wave device 110. As such, the memory unit 210 may be subdivided into a program data memory, a status data memory, and a reaction data memory. This subdivision may be performed logically, or physically.

Figure 3:
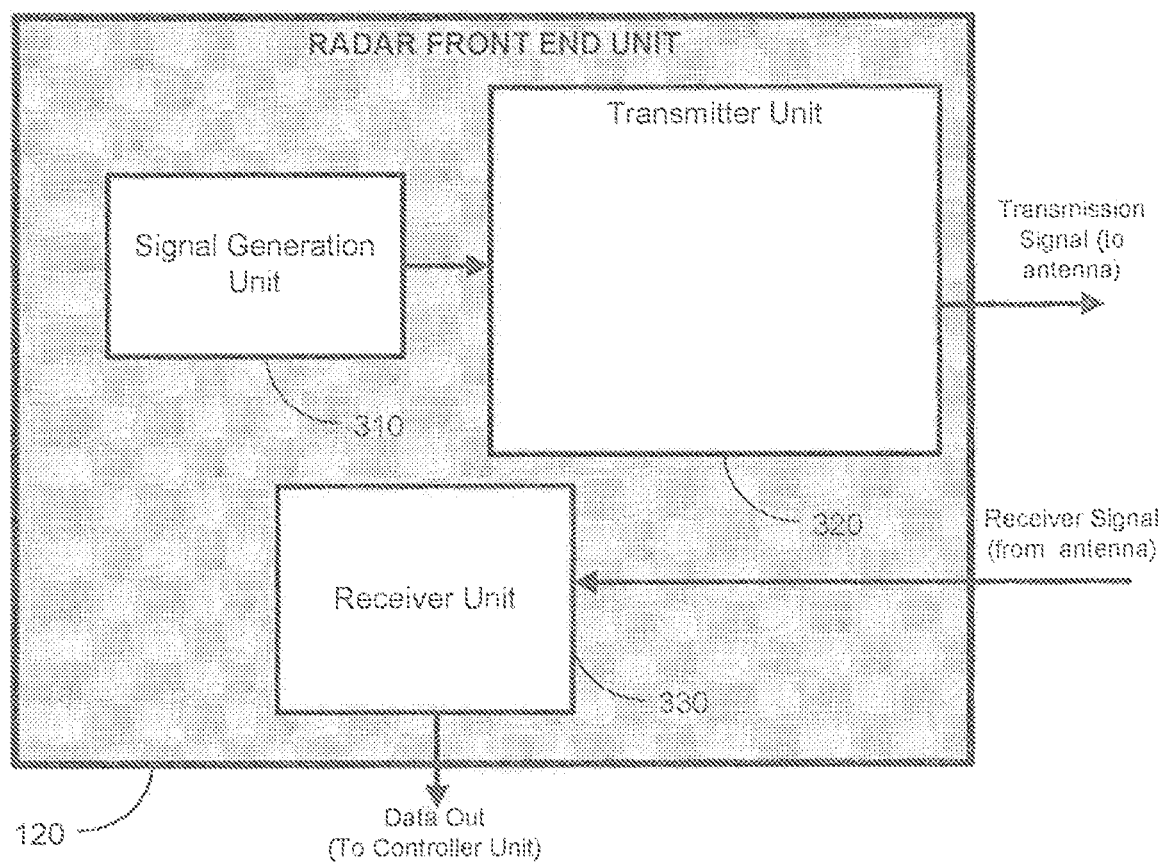
FIG. 3 illustrates a stylized block diagram depiction of the radar front end unit of FIG. 1, in accordance with embodiments herein, is illustrated.

Turning now to FIG. 3, a stylized block diagram depiction of the radar front end unit 120, in accordance with embodiments herein, is illustrated. The radar front end unit 120 may comprise a signal generation unit 310, a transmitter unit 320, and a receiver unit 330. The signal generation unit 310 is capable of generating a radar signal at a predetermined frequency. For example, a signal in the range of about 70 GHz to about 85 GHz may be generated. The signal generation unit 310 is capable of providing a radar signal for transmission. More detailed description of the signal generation unit 310 is provided below.

Continuing referring to FIG. 3, a signal for processing and transmission is provided by signal generation unit 310 to the transmitter unit 320. The transmitter unit 320 may comprise a plurality of filters, signal conditioning circuits, buffer, amplifiers, etc. for processing the signal from the signal generation unit 310. The transmission unit 320 provides a radar signal to be transmitted to the antenna unit 130.

The BPSK modulator 922 may be capable of performing back gate biasing to perform phase adjustments. In some embodiments, a BPSK modulator 922 may be implemented on each channel 920 of each transmitter 410. This may be used to calibrate out phase mismatches of different transmission channels and/or within the power combiner itself. In some embodiments, the input signal of each channel may be either advanced or delayed by adjusting the dc voltage of back-gate biases transistor devices of the BPSK modulator 922. The BPSK modulator 922 is described in FIG. 9A and FIG. 9B, and accompanying description below.

Figure 4:
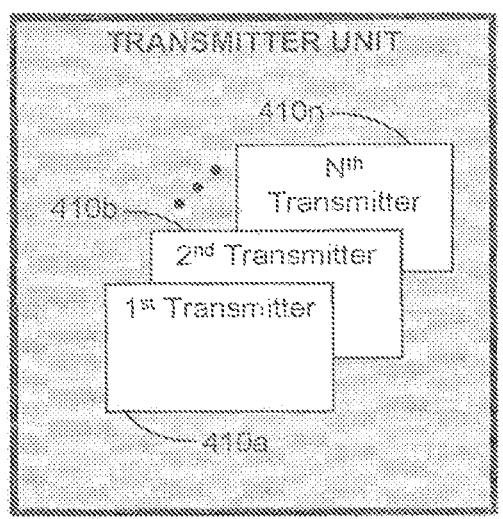
FIG. 4 illustrates a stylized block diagram of the transmitter unit of FIG. 3, in accordance with embodiments herein.

FIG. 4 illustrates a stylized block diagram of the transmitter unit 320, in accordance with embodiments herein. Referring simultaneously to FIGS. 3 and 4, the transmitter unit 320 may comprise a plurality of similar transmitters, i.e., a $1^{st}$ transmitter 410a, a $2^{nd}$ transmitter 410b, through an $N^{th}$ transmitter 410n (collectively "410"). In one embodiment, the $1^{st}$ through $N^{th}$ transmitters 410 may each process a single signal from the signal generation unit 310 and provide an output transmission signal to one or more antennas. In another embodiment, the signal generation unit 310 may provide a plurality of signals to the through $N^{th}$ transmitters 410. For example, the signal generation unit 310 may provide a signal transmit signal for each transmitter 410, or alternatively, a $1^{st}$ transmit signal for a first set of transmitters 410 and a $2^{nd}$ transmit signal for a second set of transmitters 410.

Continuing referring to FIG. 3, a received signal (i.e., a received radar signal) is provided to the receiver unit 330. The receiver unit 330 is capable of receiving the processed received signal from the signal processing unit 130. The receiver unit 330 is capable of performing analog-to-digital (A/D) conversion, signal buffering, DSP, etc. In some embodiments, the signal processing unit 130 may perform A/D conversions and DSP; however, in other embodiments, these tasks may be performed by the receiver unit 330. The receiver unit 330 is capable of directing data_out to the controller unit 140.

Figure 5:
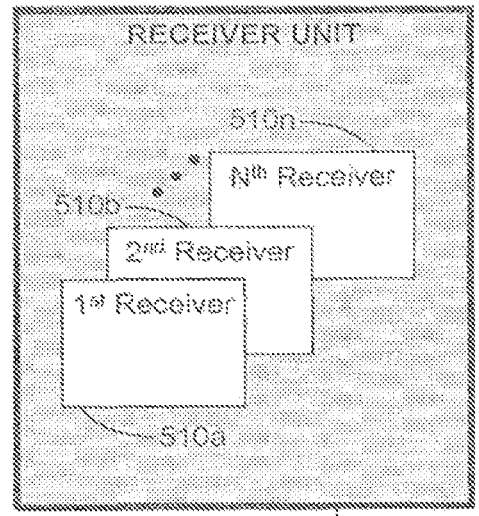
FIG. 5 illustrates a stylized block diagram of the receiver unit of FIG. 3, in accordance with embodiments herein.

FIG. 5 illustrates a stylized block diagram of the receiver unit 330, in accordance with embodiments herein. Referring simultaneously to FIGS. 3 and 5, the receiver unit 330 may comprise a plurality of similar receivers, i.e., a $1^{st}$ receiver 510a, a $2^{nd}$ receiver 510b, through an $N^{th}$ receiver 510n (collectively "510"). In one embodiment, the $1^{st}$ through $N^{th}$ receiver 510 may each process a single signal from the signal generation unit 310 and provide the signal to the controller unit 140. In another embodiment, there may provide a plurality of signals to the through $N^{th}$ receiver 510. For example, the antenna unit 130 may provide a signal to each receiver 510, or alternatively, a $1^{st}$ receiver signal for a first set of receivers 510 and a $2^{nd}$ receiver signal for a second set of receivers 510.

Figure 6:
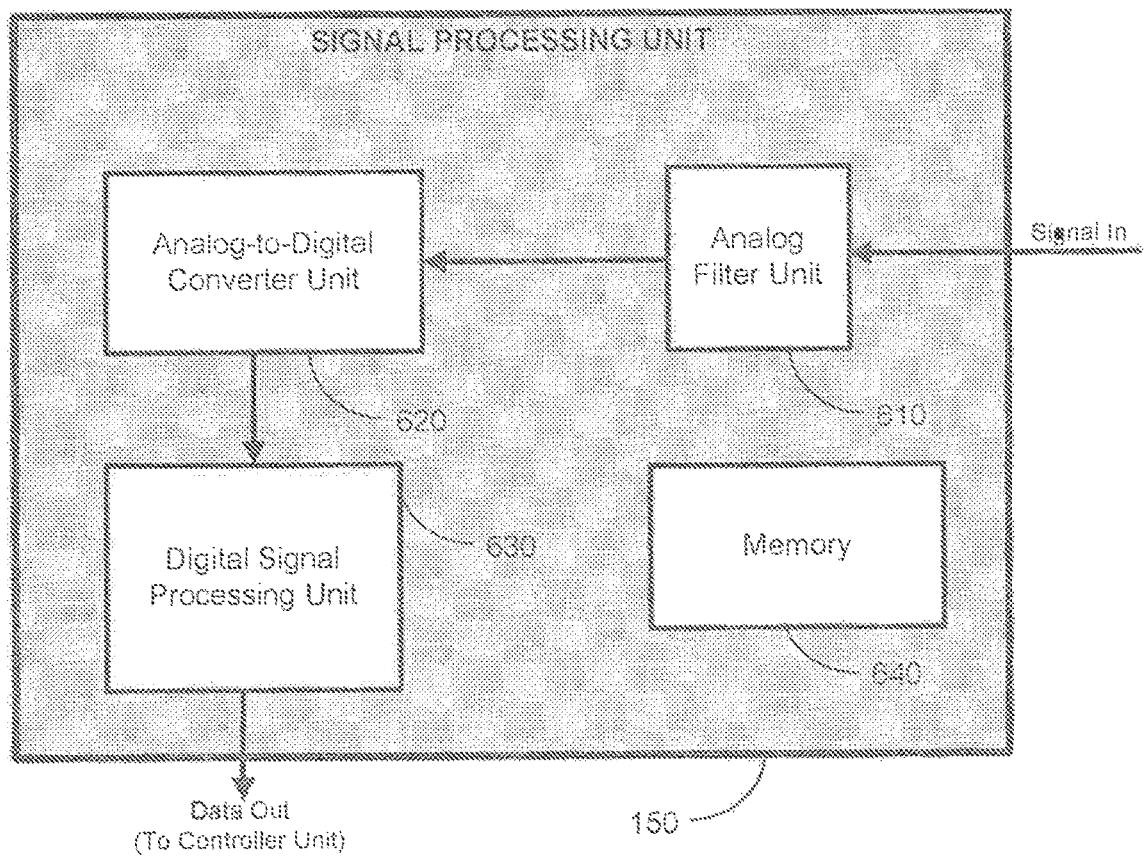
FIG. 6 illustrates a stylized block diagram depiction of the signal processing unit of FIG. 1, in accordance with embodiments herein.

Turning now to FIG. 6, a stylized block diagram depiction of the signal processing unit 150, in accordance with embodiments herein is illustrated. The signal processing unit 150 may comprise an analog filter unit 610, an A/D converter 620, a DSP unit 630, and a memory 640. The analog filter unit 610 is capable of performing filtering as well as amplification of the analog mm-wave signal received by the signal processing unit 150. Noise filtering may be performed by the analog filter unit 610 prior to performing amplification of the analog mm-wave signal.

The A/D converter 620 is capable of converting the filtered and/or amplified analog signal into a digital signal. The A/D converter 620 may be capable of performing conversions of predetermined or varying accuracy. For example, the A/D converter 620 may have an accuracy of 12-bit, 24-bit, or greater accuracy. The converted digital mm-wave signal is provided to the DSP unit 630.

The DSP unit 630 is capable of performing a variety of DSP operations on the digital mm-wave signal. For example, digital filtering of the digital mm-wave may be performed by the DSP unit 630. As an example, signal components outside of a predetermined frequency range, e.g., 70 GHz to about 85 GHz may be filtered to be of lower amplitude. In other instances, mathematical functions, such as a Fast Fourier Transform (FFT) may be performed on the mm-wave signal. The processed digital output from the DSP unit 630 may be sent to the controller unit 140 for analysis. In other instances, the digital output may be buffered or stored into a memory 640. In some cases, the memory 640 may be a first-in-first-out (FIFO) memory. In other cases, the processed digital output from the DSP unit 630 may be stored in the memory unit 210 of the controller unit 140.

Figure 7:
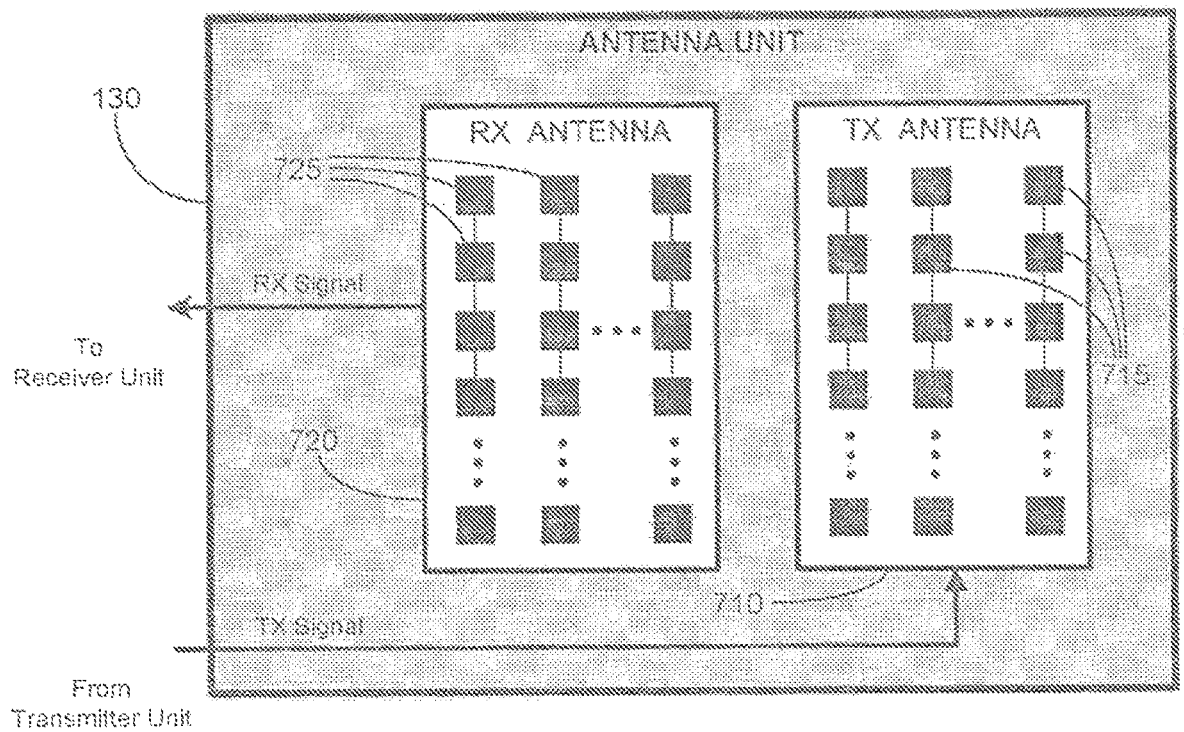
FIG. 7 illustrates a stylized block diagram depiction of the antenna unit of FIG. 1, in accordance with embodiments herein.

Turning now to FIG. 7, a stylized block diagram depiction of the antenna unit of FIG. 1, in accordance with embodiments herein, is illustrated. Millimeter-wave signals to be sent out (e.g., radar signals, network data signals, wireless communication signals, etc.) may be provided by the transmitter unit 320 (FIG. 3) to the transmit antenna 710. In one embodiment, the transmit antenna 710 may comprise a plurality of transmit antenna portions 715. The transmit antenna portions 715 are arranged in a predetermined pattern, e.g., an array matrix, as exemplified in FIG. 7.

Millimeter-wave signals that are to be received (e.g., radar signals, network data signals, wireless communication signals, etc.) may be captured by the receive antenna 720. The receive antenna 720 provides the received mm-wave signals to the receiver unit 330 (FIG. 3). In one embodiment, the receive antenna 720 may comprise a plurality of receive antenna portions 725. The receive antenna portions 725 are also arranged in a predetermined pattern, e.g., an array matrix exemplified in FIG. 7.

Figure 8:
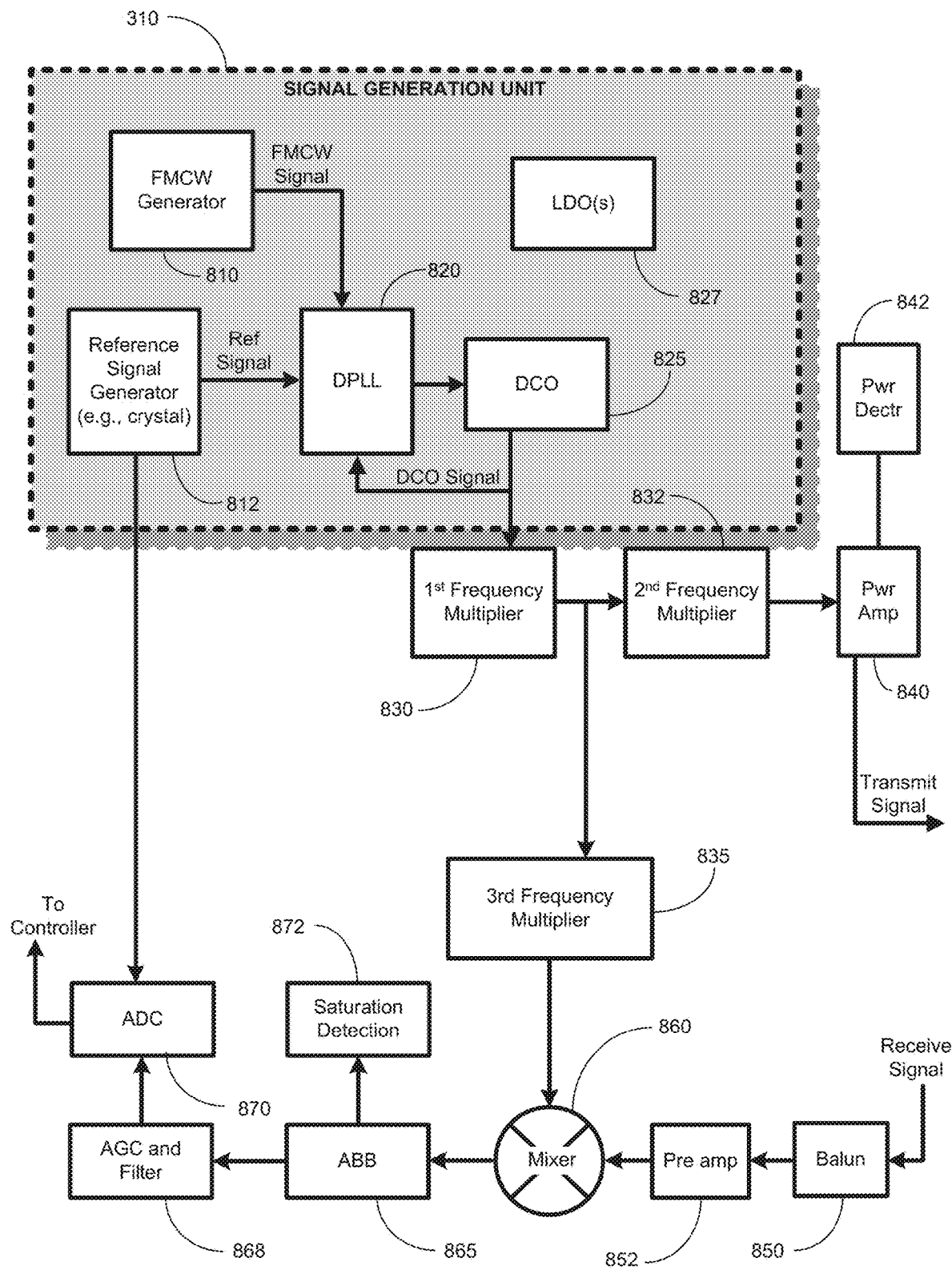
FIG. 8 illustrates a stylized block diagram depiction of an exemplary radar application of the system of FIG. 1, in accordance with embodiments herein.

Turning now to FIG. 8, a stylized block diagram depiction of an exemplary radar application of the system 100, in accordance with embodiments herein is illustrated. FIG. 8 shows an exemplary implementation of the signal generation unit 310 (FIG. 3) and exemplary portions of the transmitter unit 320 and the receiver unit 330.

The signal generation unit 310 generates a signal (e.g., a radar signal) that is to be transmitted and directed to a target region, e.g., toward the area in front of a vehicle. A frequency modulated continuous wave (FMCW) generator 810 provides an mm-wave signal in the range of about 20 GHz. The FMCW generator 810 may be configured to provide a low speed ramp (LSR) signal or a high speed ramp (HSR) signal. In alternative embodiment, the FMCW generator 810 may be replaced by a pulse train generator for application of a Pulse Doppler radar system.

Further, a reference signal is provided by a reference signal generator 812. The mm-wave signal from the FMCW generator 810 and the reference signal are both sent to a digital phase lock loop (DPLL) 820. The DPLL 820 locks the phase of the mm-wave signal from the FMCW generator 810 with the phase of the reference signal. The output of the DPLL 820 is sent to a digitally controlled oscillator (DCO) 825. The output of the DCO is fed back to the DPLL. Thus, the DCO 825 is capable of providing a stable DCO signal. The DCO signal is, in one embodiment, about 20 GHz.

A plurality of low dropout (LDO) regulators 827, which may comprise a reference voltage, an error amplifier, a feedback voltage divider, and a plurality of pass elements, e.g., transistors. The LDO regulators 827 are configured to provide a regulated voltage supply to the various portions of the circuit of FIG. 8. Generally, this regulated voltage supply is lower than the supply voltage.

In some embodiments, it is desirable to transmit an 80 GHz signal, for example in a vehicle radar application. The DCO 825 provides a 20 GHz signal, therefore, two frequency doublers may be used to multiply the 20 GHz signal to provide a 40 GHz, and then multiply the 40 GHz signal to provide an 80 GHz signal to transmit. Accordingly, a $1^{st}$ frequency multiplier 830 is used to double the 20 GHz signal to produce a 40 GHz signal. A $2^{nd}$ frequency multiplier 832 is used to double the 40 GHz signal to produce an 80 GHz signal. The output of the $2^{nd}$ frequency multiplier 832 is provided to a power amplifier 840. The output of the power amplifier 840 may be provided to the antenna for transmission. A power detector 842 may detect the power of the output of the power amplifier 840, and may prompt feedback adjustments in order to maintain a predetermined power level of the transmit signal.

A received signal may be processed by the circuit shown in FIG. 8. The received signal, e.g., from the signal processing unit 150, is provided to a balun circuit 850. The balun may comprise a transformer, and provides a differential output to a pre-amplifier 852. After performing a pre-amplification of the received signal, the output from the pre-amplifier 852 is provided to the mixer 860.

The mixer 860 is capable of combining the received signal from the pre-amplifier 852, with an output signal from a $3^{rd}$ frequency multiplier 835. The output of the $3^{rd}$ frequency multiplier 835 is the doubled version of the 40 GHz signal from the $1^{st}$ frequency multiplier. That is, the output of the $3^{rd}$ frequency multiplier 835 is an 80 GHz reference signal. The mixer 860 receives the reference 80 GHz signal and in one embodiment, multiplies it to the received signal, which is a reflected or echo signal resulting from the reflection from the transmitted signal. The output of the mixer may be used to determine various characteristics regarding an object(s) from which the transmitted signal was reflected, including direction, location, trajectory, and/or speed of the object.

Each of the $1^{st}$, $2^{nd}$, and $3^{rd}$ frequency multipliers 830, 832, 835 may be a fully differential push-push frequency doubler. The frequency doubler employed by the frequency multipliers 830, 832, 835 is described in further details below.

The output of the mixer 860 is provided to an ABB 865. The output of the ABB 865 is provided to an automatic gain control (AGC) and filter circuits 868. A saturation detection circuit 872 may detect any saturation of the signal processed by the AGC/filter circuits 868 and perform responsive adjustment. The output of the AGC/filter circuits 868 is provided to an A/D converter 870. The output of the A/D converter 870 may be provided to the controller unit 140 for further processing and responsive actions.

The person of ordinary skill in the art will be aware of modifications that may be made to the exemplary embodiments depicted in FIGS. 2-8 as a routine matter.

Figure 9A:
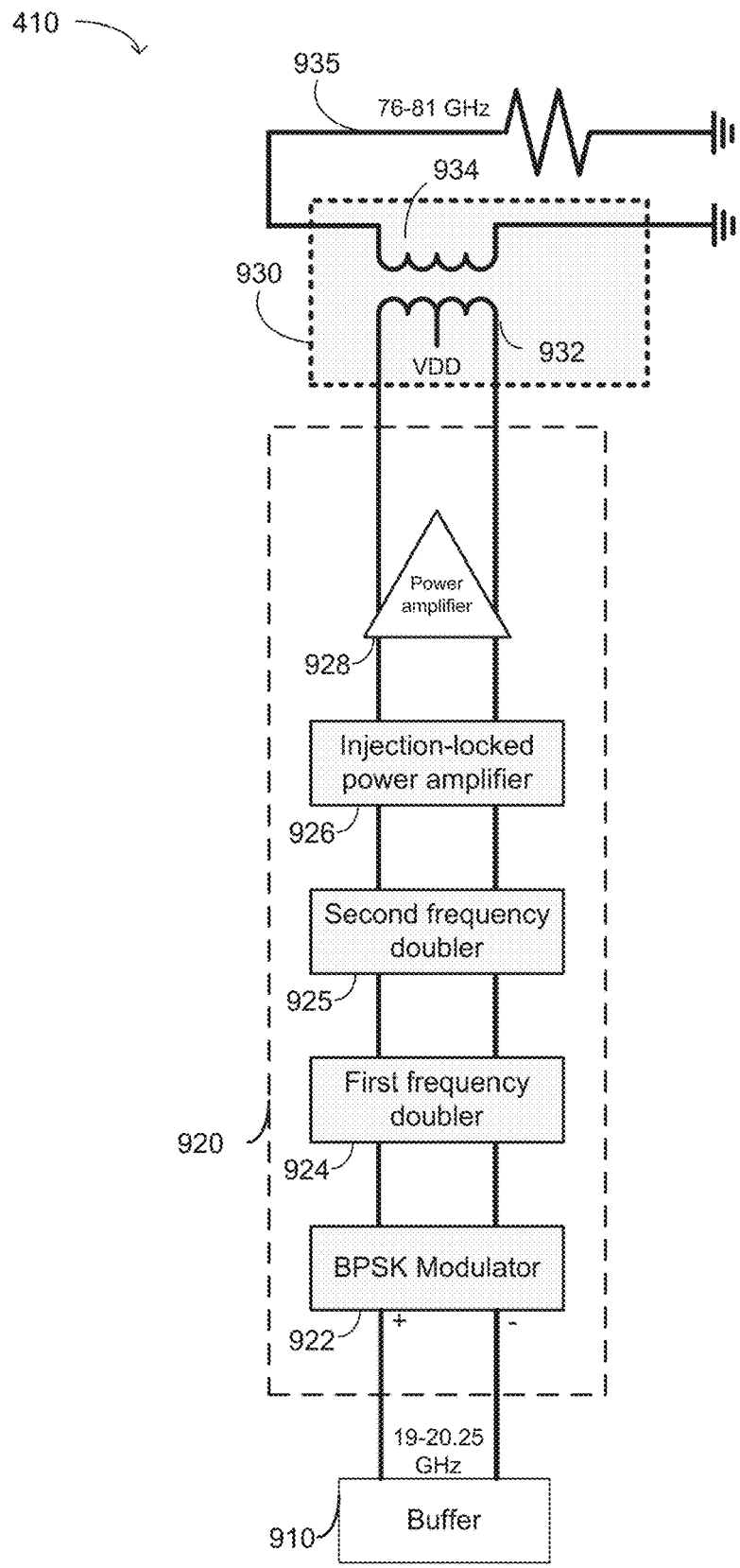
FIG. 9A illustrates a stylized block diagram depiction of a transmitter with binary phase-shift keying (BPSK) modulation, in accordance with embodiments herein.

FIG. 9A depicts an implementation of a frequency modulated continuous wave (FMCW) transmitter, in accordance with embodiments herein. The FMCW transmitter may be a transmitter unit 320 of a millimeter wave device 100, but in other embodiments, the FMCW transmitter may be a component of another device.

The transmitter unit 320 comprises one or more transmitters 410, of which one representative transmitter 410 is partially shown in FIG. 9A. Transmitter 410 comprises a buffer 910 configured to receive a differential input signal having a first frequency. In the embodiment depicted in FIG. 9A, the first frequency may be from about 19 GHz to about 20.25 GHz. In other embodiments, the first frequency may be in a different frequency range. For example, in the embodiment depicted in FIG. 9B, the first frequency may be from about 38 GHz to about 40.5 GHz.

The buffer 910 is configured to provide a differential output to a channel 920.

In channel 920, a BPSK modulator 922 is configured to receive the differential signal put out by the buffer 910. The BPSK modulator 922 is configured to provide a modulated frequency having the first frequency and a first clock phase. Unlike previous BPSK modulators disposed at the end of transmit chains, which are configured to provide a modulated signal having a first clock phase of 180°, the BPSK modulator 922 is configured to provide a modulate signal having a lower clock phase, such as 45° or 90°. The BPSK modulator 922 will be described later in more detail with reference to FIGS. 10A-C.

The BPSK modulator 922 provides a differential modulated signal to subsequent components of the channel 920. For example, the BPSK modulator 922 may provide the differential output signal to a series comprising one or more frequency multipliers. In some embodiments, the term "series comprising one or more frequency multipliers" may refer to a circuit in which one or more frequency multipliers are arranged in a series configuration. In the depicted embodiment, the BPSK modulator 922 provides the differential output signal to a first frequency doubler 924 and a second frequency doubler 925. The first frequency doubler 924 and the second frequency doubler 925 may each be a push-pull frequency doubler (PPFD), as is known in the art. In embodiments wherein the first frequency is from about 19 GHz to about 20.25 GHz, the series comprising the first frequency doubler 924 and the second frequency doubler 925 may provide an output signal with a second frequency from about 76 GHz to about 81 GHz. More generally, the second frequency will depend on the first frequency, the number of frequency multipliers, and the frequency multiplication provided by each frequency multiplier.

In other embodiments, not shown, frequency multipliers may be omitted, and the channel 920 provides an output signal with a frequency equal to the first frequency of the differential signal received by the buffer 910.

Figure 9B:
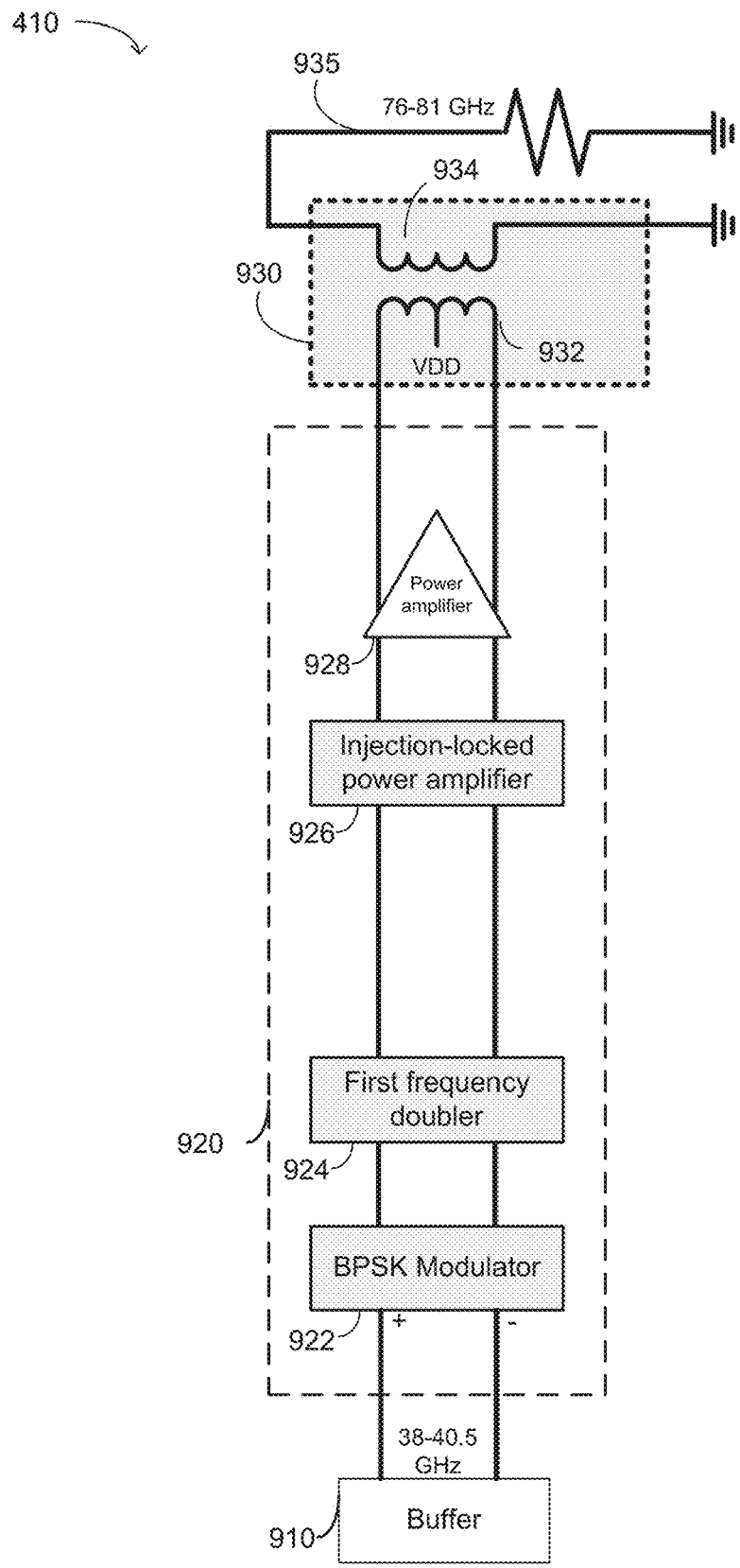
FIG. 9B illustrates a stylized block diagram depiction of an alternative transmitter with BPSK modulation, in accordance with embodiments herein.

The channel 920 may also comprise an injection-locked power amplifier (ILPA) 926, as shown in FIG. 9A and FIG. 9B. ILPAs are known and hence ILPA 926 need not be described in detail. The ILPA 926 is optional and may be omitted as a routine matter by the person of ordinary skill in the art having the benefit of the present disclosure.

The channel 920 also comprises a power amplifier 928. The power amplifier 928 is configured to amplify the power of the differential signal provided by the BPSK modulator 922 and any other components of the channel 920. Power amplifiers are known and power amplifier 928 will not be described in further detail.

The transmitter 410 also comprises a transformer 930. The channel 920 provides a differential input to primary winding 932 of the transformer 930, and the secondary winding 934 transforms the signal to a single-ended radio frequency output provided by output subcircuit 935. The output subcircuit 935 may drive the output load at any suitable resistance, e.g., in one embodiment, 50Ω. The radio frequency output may be suitable for transmission by the millimeter-wave device 100.

In embodiments, the transformer 930 may comprise vertically coupled transformers with dual UTMs or sideways coupling transformers with single or dual UTMs. The person of ordinary skill in the art having the benefit of the present disclosure may routinely implement other embodiments of the transformer 930 as a routine matter.

Although the foregoing discussion has referred to FIG. 9A, it applies substantially in its entirety to FIG. 9B. What is different in the embodiment depicted in FIG. 9B is that the first frequency is from about 38-40.5 GHz and the channel 920 comprises only the first frequency doubler 924. The other elements of FIG. 9B are as described above with regard to FIG. 9A and need not be discussed further.

Figure 10A:
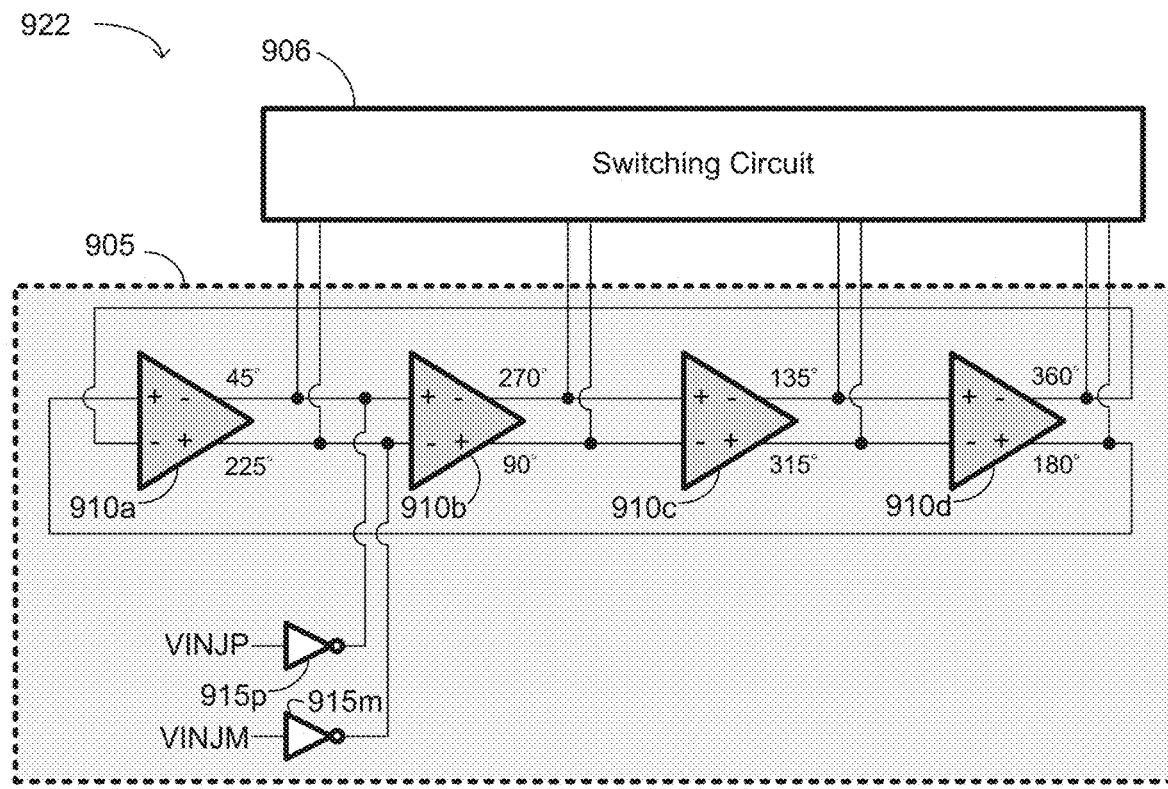
FIG. 10A illustrates a stylized block diagram depiction of a BPSK modulator, in accordance with embodiments herein.

Turning to FIG. 10A, a BPSK modulator 922 of channel 920 of the transmitter unit 320 will be described in more detail. In the depicted embodiment, the BPSK modulator 922 comprises a ring oscillator 905, which may be a differential four-stage injection-locked ring oscillator, and a switching circuit 906.

The ring oscillator 905 comprises four stages, 910a, 910b, 910c, and 910d. Each stage (generically, 910) receives two inputs with phases 180° apart. Herein, any pair of signals with phases 180° apart may be referred to as "P"/"+" and "M"/"−." Desirably, the signals are each square wave signals that rapidly swing from VDD to ground. Further, each stage 910 inverts each received input, shifts each received input by 135°, and provides two outputs with phases 180° apart. For example, stage 910a receives signals with phases of 180° (+) and 360° (−), inverts and shifts the inputs by 135°, and provides outputs of 45° (−) and 225° (+). Stage 910b receives signals with phases of 45° (+) and 225° (−), inverts and shifts the inputs by 135°, and provides outputs of 270° (−) and 90° (+). Stage 910c receives signals with phases of 270° (+) and 315° (−), inverts and shifts the inputs by 135°, and provides outputs of 360° (−) and 180° (+).

The four stage differential ring oscillator 905 further comprises two injection inputs, i.e., VINJP and VINJM, to one of the stages, e.g., stage 910b. The frequency of the injected inputs drives the four stage differential ring oscillator 905. As depicted, the injection inputs VINJP and VINJM pass through an inverter 915p or 915m, respectively, prior to being received by the third stage 910b.

Of the four stages 910a-d, the outputs of each stage are provided to switching circuit 906. Exemplary embodiments of the switching circuit 906 will be described in more detail below with reference to FIGS. 10B and 10C.

Figure 10B:
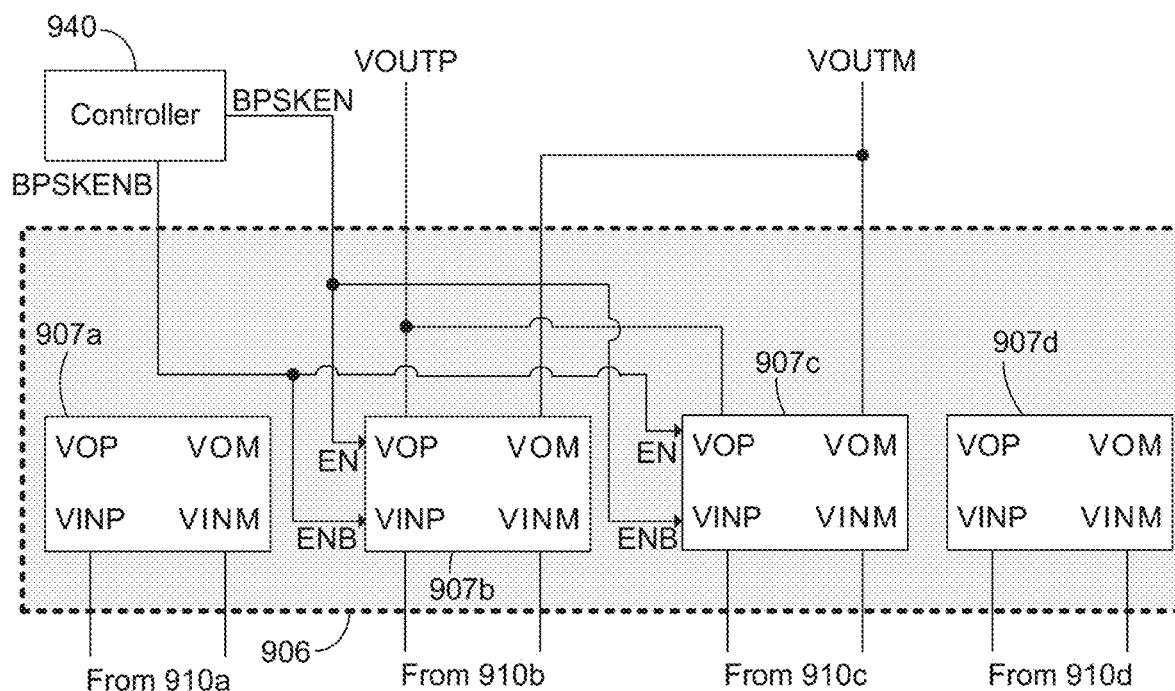
FIG. 10B illustrates a stylized block diagram depiction of a switching circuit suitable for use in a transmitter comprising two frequency doublers, in accordance with embodiments herein.

FIG. 10B depicts one embodiment of switching circuit 906 suitable for use in a channel 920 comprising two frequency doublers 924 and 925. The switching circuit 906 of this embodiment comprises four radio frequency (RF) switches 907a-907d (generically, RF switches 907). Two RF switches, e.g. RF switches 907a and 907d, are dummy switches included solely for convenient fabrication of a semiconductor device comprising the switching circuit 906. (In other embodiments, not shown, dummy switches may be omitted). The two active switches, 907b and 907c, are each configured to receive differential signals from one stage of ring oscillator 905, e.g. RF switch 907b is configured to receive signals from stage 910b and RF switch 907c is configured to receive signals from stage 910c. As a reminder, referring back to FIG. 10A, the signals from stages 910b and 910c differ by 45°, i.e., the signals have first and second phase shifts differing by 45°.

A system-level controller, represented in FIG. 10B by the block labeled "controller 940," provides two signals, BPSKEN and BPSKENB to both active switches 907b and 907c. The controller 940 is configured such that when one of BPSKEN or BPSKENB is high, the other is low. Switch 907b is configured such that it is enabled by BPSKEN and switch 907c is configured such that it is enabled by BPSKENB. Depending on the independent assertion or deassertion of BPSKEN and BPSKENB, during operation, switching circuit 906 will pass either the first phase shift of the signal from stage 910b through switch 907b to VOUTP and VOUTM (when BPSKEN is high) or the second phase shifts of the signal from stage 910c through switch 907c to VOUTP and VOUTM (when BPSKENB is high). In the embodiment of FIG. 10B, the VOUTP and VOUTM signals will have a first clock phase of 45°. Upon provision of these signals to the series of frequency multipliers of FIG. 9A, i.e., first frequency doubler 924 and second frequency doubler 925, the multiplication by four to yield the second frequency will yield a second clock phase having the desirable value of 180°.

Figure 10C:
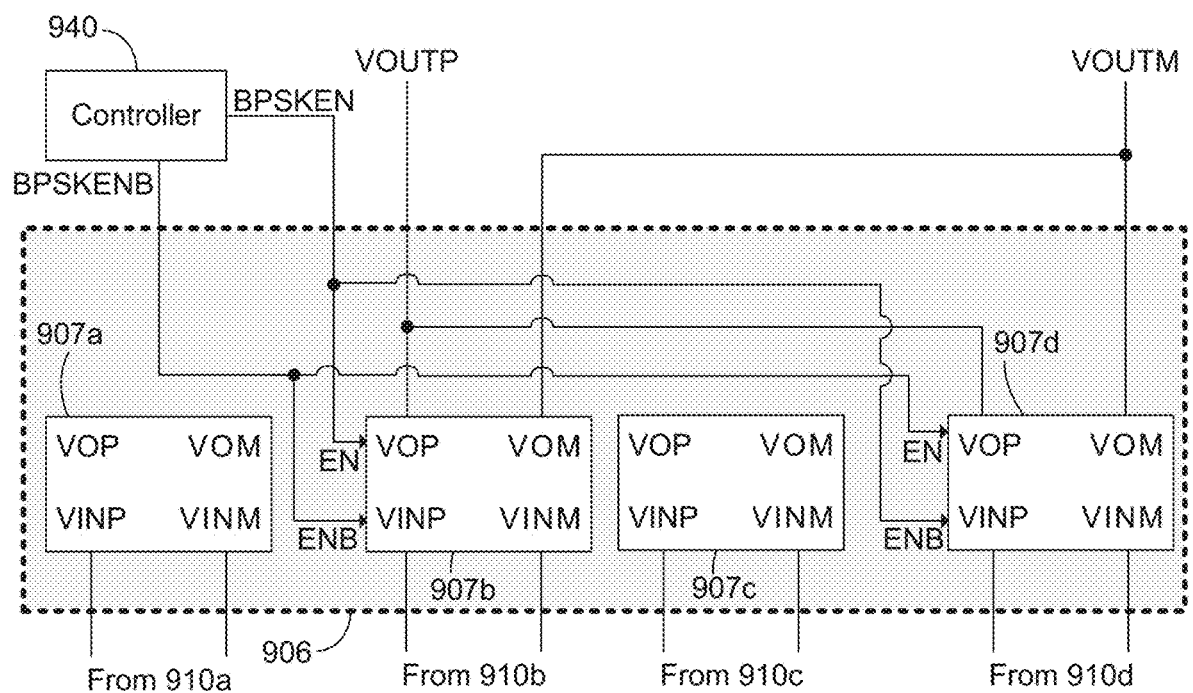
FIG. 10C illustrates a stylized block diagram depiction of a switching circuit suitable for use in a transmitter comprising one frequency doubler, in accordance with embodiments herein.

FIG. 10C illustrates a stylized block diagram depiction of a BPSK modulator suitable for use in a transmitter comprising one frequency doubler, in accordance with embodiments herein. FIG. 10C has numerous elements in common with FIG. 10B. The following discussion of FIG. 10C will be directed to differences from FIG. 10B.

First, the switching circuit 906 depicted in FIG. 10C comprises two active RF switches, 907b and 907d. With reference back to FIG. 10A, the signals provided to RF switches 907b and 907d can be seen to come from stages 910b and 910d, which have first and second phase shifts differing by 90°. Accordingly, in the embodiment of FIG. 10C, the switching circuit will provide VOUTP and VOUTM signals having a first clock phase of 90°. Upon provision of these signals to the frequency multiplier of FIG. 9B, i.e., first frequency doubler 924, the multiplication by two to yield the second frequency will yield a second clock phase having the desirable value of 180°.

Figure 11A:
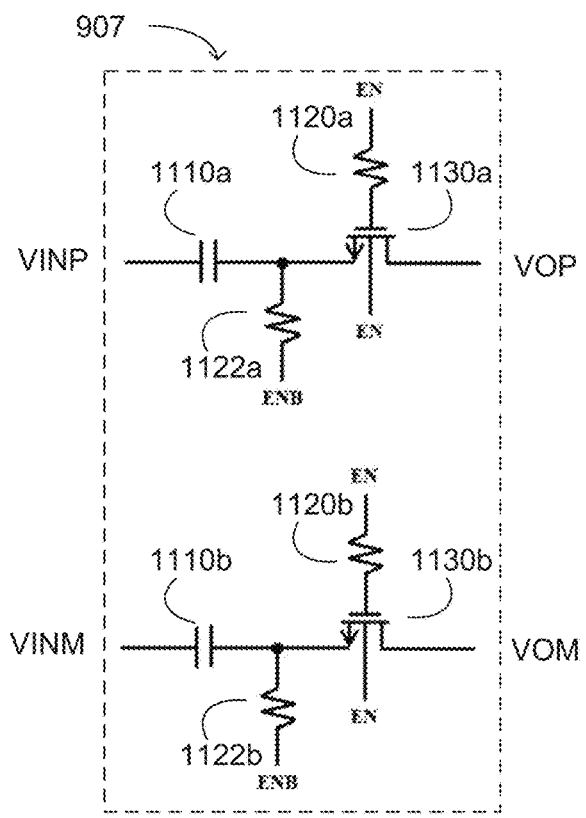
FIG. 11A illustrates a stylized circuit depiction of a differential radio frequency (RF) switch, in accordance with embodiments herein.

FIG. 11A illustrates a stylized circuit depiction of a differential radio frequency (RF) switch 907, in accordance with embodiments herein. The RF switch 907 comprises two subcircuits, one receiving signal VINP from a stage 910, and the other receiving VINM signal from the stage 910. Each subcircuit comprises a capacitor 1110a or 1110b, and a transistor 1130a or 1130b, from which output signal VOP or VOM is provided. The front gate of each transistor 1130a or 1130b is controlled by signal EN, floating through resistor 1120a or 1120b, respectively. The input to each transistor 1130a or 1130b is modulated by signal ENB, floating through resistor 1122a or 1122b, respectively.

Figure 11B:
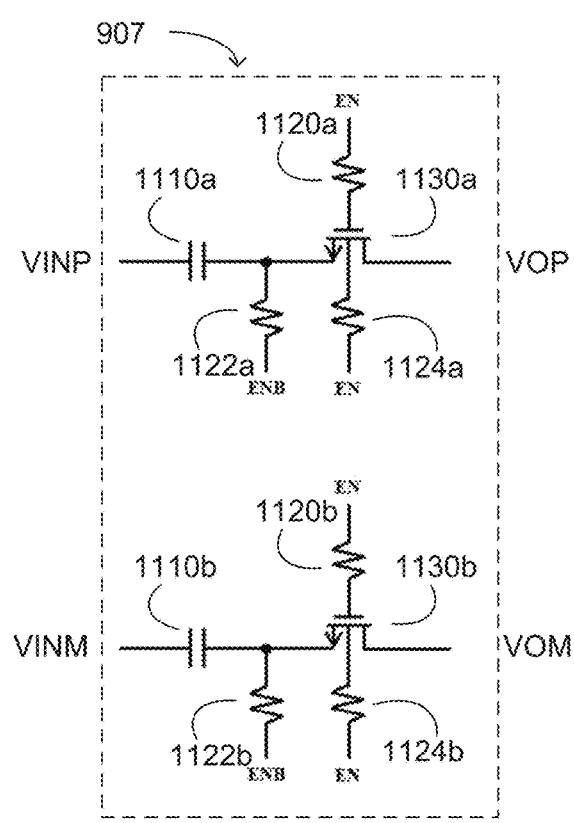
FIG. 11B illustrates a stylized circuit depiction of a differential RF switch with a floating back gate, in accordance with embodiments herein.

FIG. 11B illustrates a stylized circuit depiction of a differential RF switch with a floating back gate, in accordance with embodiments herein. The RF switch 907 shown in FIG. 11B resembles that shown in FIG. 11A, and the following discussion will focus on differences. Specifically, the back gates of transistors 1130a and 1130b are controlled by signal EN, floating through resistor 1124a or 1124b, respectively.

In various embodiments, the present disclosure relates to a semiconductor device, comprising a transmitter, comprising a modulator configured to receive a differential input signal having a first frequency and provide a differential modulated signal having the first frequency and a first clock phase; a series comprising one or more frequency multipliers, wherein the series of frequency multipliers is configured to receive the differential modulated signal and provide a differential second signal having a second frequency greater than the first frequency and having a second clock phase; and an output transformer configured to receive the differential second signal and transform the differential second signal to a single-ended output signal.

In one embodiment, the first frequency is (i) from about 19 GHz to about 20.25 GHz or (ii) from about 38 GHz to about 40.5 GHz, and the second frequency is from about 76 GHz to about 81 GHz.

In one embodiment, the modulator comprises an injection-locked ring oscillator configured to generate a plurality of phase shifts; and a switching circuit configured to select the first clock phase from the plurality of phase shifts. In a further embodiment, the switching circuit comprises a plurality of radio frequency (RF) switches comprising a first RF switch configured to provide the first clock phase at a first phase shift and a second RF switch configured to provide the first clock phase at a second phase shift, wherein the first and second phase shift are either 45° apart or 90° apart.

In one embodiment, the series of frequency multipliers comprises a first frequency multiplier configured to multiply the frequency of the differential modulated signal by two, and a second frequency multiplier configured to further multiply the frequency of the differential modulated signal by two. In one embodiment, the modulator comprises at least two RF switches configured to select the first clock phase from among a plurality of phase shifts which are 90° apart.

In one embodiment, the series of frequency multipliers comprises a first frequency multiplier configured to multiply the frequency of the differential modulated signal by two. In one embodiment, the modulator comprises at least two RF switches configured to select the first clock phase from among the plurality of phase shifts which are 45° apart.

In one embodiment, the semiconductor device further comprises a series of power amplifiers, wherein the series of power amplifiers is configured to receive the differential second signal, amplify the differential second signal, and provide the differential second signal after amplification to the output transformer. In a further embodiment, the series of power amplifiers comprises an injection-locked power amplifier (ILPA) and a power amplifier.

Figure 12:
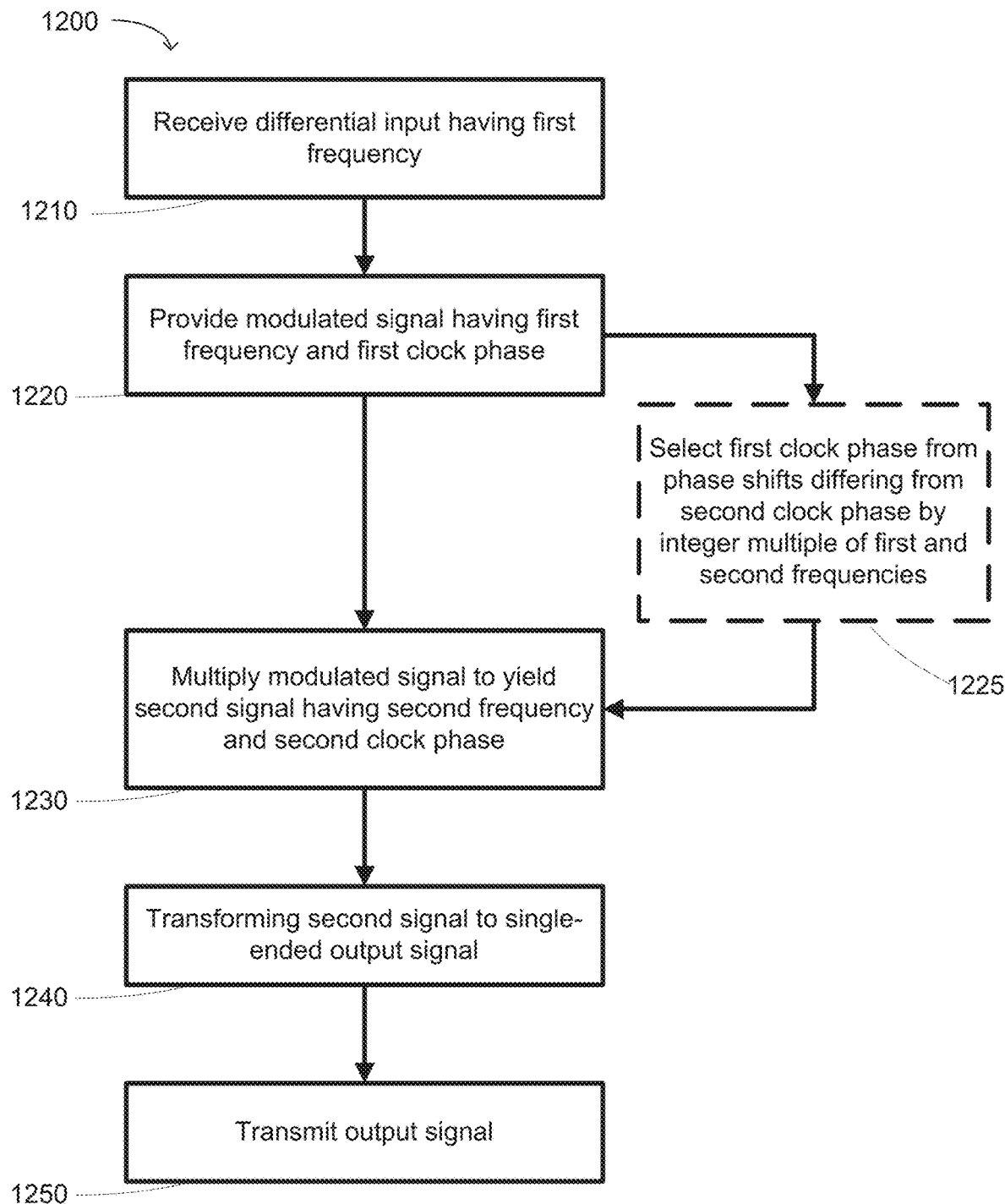
FIG. 12 illustrates a flowchart of a method, in accordance with embodiments herein.

FIG. 12 provides a flowchart of a method 1200, in accordance with embodiments herein. As depicted, the method 1200 comprises receiving (at 1210) receiving a differential input signal having a first frequency. The receiving (at 1210) may be performed by a modulator, such as a BPSK modulator as described above. In one embodiment, the first frequency may be from about 19 GHz to about 20.25 GHz. In another embodiment, the first frequency may be from about 38 GHz to about 40.5 GHz.

The method 1200 also involves providing (at 1220) a differential modulated signal having the first frequency and a first clock phase. The providing (at 1220) may be performed by the modulator referred to above. In one embodiment, the first clock phase is 45°. In another embodiment, the first clock phase is 90°.

Subsequently, the method 1200 involves multiplying (at 1230) the differential modulated signal to yield a differential second signal having a second frequency greater than the first frequency and having a second clock phase. In one embodiment, the second clock phase is 180°. The multiplying (at 1230) may be performed by a series of one or more frequency multipliers. In one embodiment, the multiplying (at 1230) may be performed by two frequency doublers. In another embodiment, the multiplying (at 1230) may be performed by one frequency doubler.

In one embodiment, wherein the second frequency is an integer multiple of the first frequency, the method 1200 may further comprise selecting (at 1225) the first clock phase, wherein the first clock phase is selected from a first phase shift and a second phase shift that differ by the second clock phase divided by the integer multiple. The selecting (at 1225) may be performed by the modulator referred to above. For example, the integer multiple may be two, such as may be achieved by the multiplying (at 1230) being performed by one frequency doubler. For another example, the integer multiple may be four, such as may be achieved by the multiplying (at 1230) being performed by two frequency doublers.

The method 1200 further comprises transforming (at 1240) the differential second signal to a single-ended output signal. The transforming (at 1240) may be performed an output transformer.

Further, the method 1200 comprises transmitting (at 1250) the single-ended output signal. The method 1200 may be appropriate in a radar application, a communications application, or any other mm-wave application.

Figure 13:
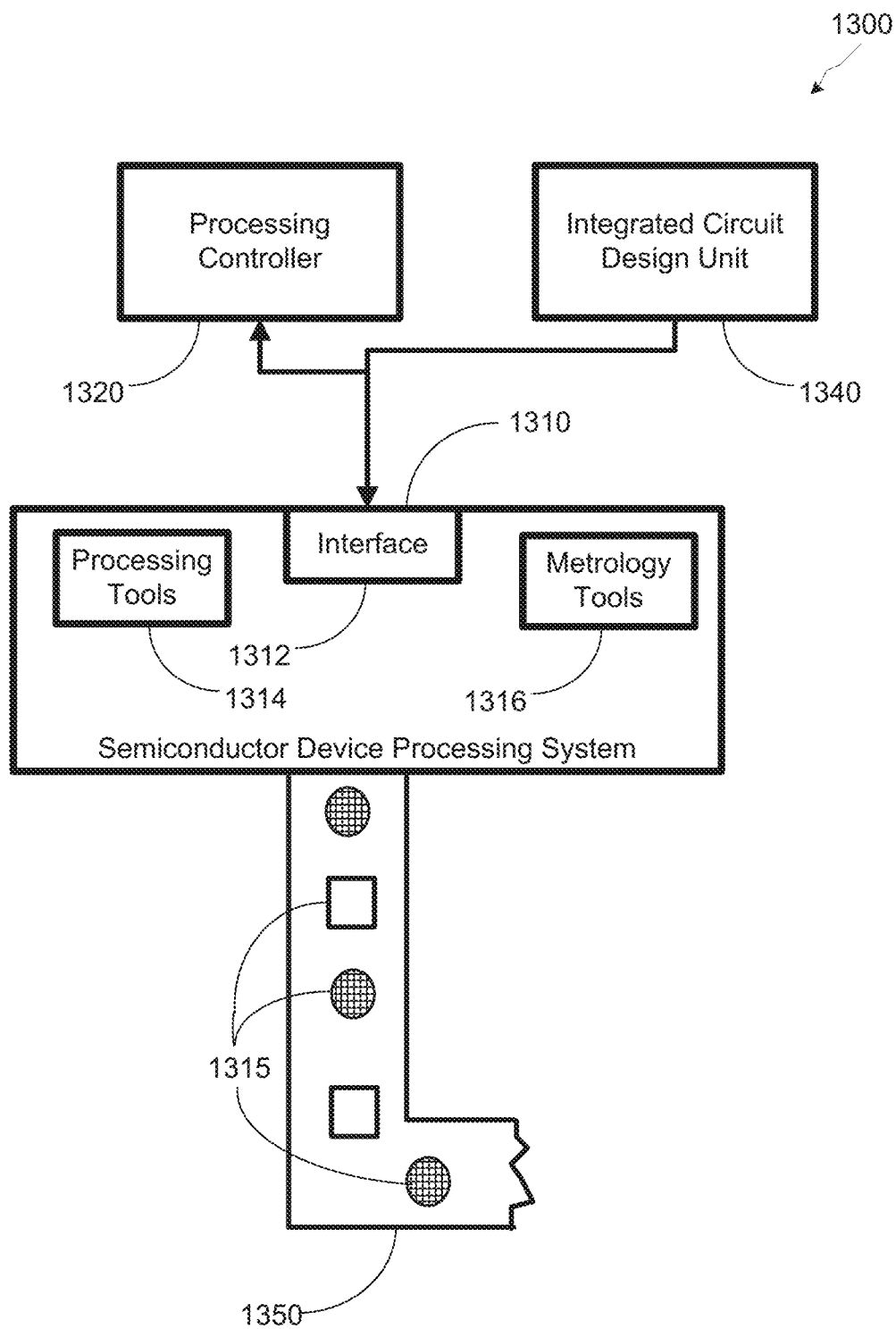
FIG. 13 illustrates a stylized depiction of a system for fabricating a semiconductor device, in accordance with embodiments herein.

Turning now to FIG. 13, a stylized depiction of a system 1300 for fabricating a semiconductor device package comprising a transmitter unit 320, in accordance with embodiments herein, is illustrated. A system 1300 of FIG. 13 may comprise a semiconductor device processing system 1310 and an integrated circuit design unit 1340. The semiconductor device processing system 1310 may manufacture integrated circuit devices based upon one or more designs provided by the integrated circuit design unit 1340.

The semiconductor device processing system 1310 may comprise various processing stations, such as etch process stations, photolithography process stations, CMP process stations, etc. Each of the processing stations may comprise one or more processing tools 1314 and or metrology tools 1316. Feedback based on data from the metrology tools 1316 may be used to modify one or more process parameters used by the processing tools 1314 for performing process steps.

The semiconductor device processing system 1310 may also comprise an interface 1312 that is capable of providing communications between the processing tools 1314, the metrology tools 1316, and a controller, such as the processing controller 1320. One or more of the processing steps performed by the semiconductor device processing system 1310 may be controlled by the processing controller 1320. The processing controller 1320 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc.

The semiconductor device processing system 1310 may produce integrated circuits on a medium, such as silicon wafers. More particularly, the semiconductor device processing system 1310 may produce integrated circuits comprising a millimeter wave device 100 comprising a transmitter unit 320 comprising at least one transmitter 410, such as is depicted in FIG. 9A or FIG. 9B.

The production of integrated circuits by the semiconductor device processing system 1310 may be based upon the circuit designs provided by the integrated circuit design unit 1340. The semiconductor device processing system 1310 may provide processed integrated circuits/devices 1315 on a transport mechanism 1350, such as a conveyor system. In some embodiments, the conveyor system may be sophisticated clean room transport systems that are capable of transporting semiconductor wafers.

In some embodiments, the items labeled "1315" may represent individual wafers, and in other embodiments, the items 1315 may represent a group of semiconductor wafers, e.g., a "lot" of semiconductor wafers. The integrated circuit or device 1315 may comprise a transistor, a capacitor, a resistor, a memory cell, a processor, and/or the like.

The integrated circuit design unit 1340 of the system 1300 is capable of providing a circuit design that may be manufactured by the semiconductor device processing system 1310. The integrated circuit design unit 1340 may be capable of determining the number of devices (e.g., transmitter units 320, etc.) to place in a device package. Based upon such details of the devices, the integrated circuit design unit 1340 may determine specifications of the devices that are to be manufactured. Based upon these specifications, the integrated circuit design unit 1340 may provide data for manufacturing a semiconductor device package described herein.

The system 1300 may be capable of performing analysis and manufacturing of various products involving various technologies. For example, the system 1300 may receive design and production data for manufacturing devices of CMOS technology, Flash technology, BiCMOS technology, power devices, memory devices (e.g., DRAM devices), NAND memory devices, and/or various other semiconductor technologies. This data may be used by the system 1300 to fabricate semiconductor devices described herein.

The transistors of the transmitter unit 320 described in embodiments herein may be formed using a fully-depleted silicon-on-insulator (FDSOI) process. The processing performed by the system 1300 may be an FDSOI process.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A semiconductor device, comprising:
a transmitter, comprising:
a first circuit configured to receive a differential input signal having a first frequency and provide a differential modulated signal having the first frequency and a first clock phase, the first circuit comprising:
an injection-locked ring oscillator configured to generate a plurality of phase shifts; and
a switching circuit configured to select the first clock phase from the plurality of phase shifts;
a second circuit comprising one or more frequency multipliers, wherein the one or more frequency multipliers is configured to receive the differential modulated signal and provide a differential second signal having a second frequency greater than the first frequency and having a second clock phase; and
an output transformer configured to receive the differential second signal and transform the differential second signal to a single-ended output signal.

2. The semiconductor device of claim 1, wherein the first frequency is (i) from about 19 GHz to about 20.25 GHz or (ii) from about 38 GHz to about 40.5 GHz, and the second frequency is from about 76 GHz to about 81 GHz.

3. The semiconductor device of claim 1, wherein the switching circuit comprises:
a plurality of radio frequency (RF) switches comprising a first RF switch configured to provide the first clock phase at a first phase shift and a second RF switch configured to provide the first clock phase at a second phase shift, wherein the first and second phase shift are either 45° apart or 90° apart.

4. The semiconductor device of claim 3, wherein:
the second circuit comprises a first frequency multiplier configured to multiply the frequency of the differential modulated signal by two, and a second frequency multiplier configured to further multiply the frequency of the differential modulated signal by two.

5. The semiconductor device of claim 4, wherein:
the first circuit comprises at least two RF switches configured to select the first clock phase from among a plurality of phase shifts which are 45° apart.

6. The semiconductor device of claim 3, wherein:
the second circuit comprises a first frequency multiplier configured to multiply the frequency of the differential modulated signal by two.

7. The semiconductor device of claim 6, wherein:
the first circuit comprises at least two RF switches configured to select the first clock phase from among the plurality of phase shifts which are 90° apart.

8. A semiconductor device, comprising:
a transmitter, comprising:
   a first circuit configured to receive a differential input signal having a first frequency and provide a differential modulated signal having the first frequency and a first clock phase,
   a second circuit comprising one or more frequency multipliers, wherein the one or more frequency multipliers is configured to receive the differential modulated signal and provide a differential second signal having a second frequency greater than the first frequency and having a second clock phase;
   an output transformer configured to receive the differential second signal and transform the differential second signal to a single-ended output signal; and
   a series of power amplifiers, wherein the series of power amplifiers is configured to receive the differential second signal, amplify the differential second signal, and provide the differential second signal after amplification to the output transformer.

9. The semiconductor device of claim 8, wherein:
the one or more power amplifiers comprises an injection-locked power amplifier (ILPA) and a power amplifier.

10. A method, comprising:
   receiving, by a modulator, a differential input signal having a first frequency;
   providing, by the modulator, a differential modulated signal having the first frequency and a first clock phase;
   multiplying, by a series of one or more frequency multipliers, the differential modulated signal to yield a differential second signal having a second frequency greater than and an integer multiple of the first frequency and having a second clock phase;
   transforming, by an output transformer, the differential second signal to a single-ended output signal; and
   transmitting the single-ended output signal.

11. The method of claim 10, wherein the method further comprises:
   selecting, by the modulator, the first clock phase, wherein the first clock phase is selected from a first phase shift and a second phase shift that differ by the second clock phase divided by the integer multiple.

12. The method of claim 11, wherein the integer multiple is two or four.

13. A system, comprising:
   a semiconductor device processing system to manufacture a semiconductor device; and
   a processing controller operatively coupled to said semiconductor device processing system, said processing controller configured to control an operation of the semiconductor device processing system;
   wherein the semiconductor device processing system is adapted to:
   form a transmitter by forming:
      a modulator configured to receive a differential input signal having a first frequency and provide a differential modulated signal having the first frequency and a first clock phase using an injection-locked ring oscillator configured to generate a plurality of phase shifts and a switching circuit configured to select the first clock phase from the plurality of phase shifts;
      a series comprising one or more frequency multipliers, wherein the series of frequency multipliers is configured to receive the differential modulated signal and provide a differential second signal having a second frequency greater than the first frequency and having a second clock phase; and
      an output transformer configured to receive the differential second signal and transform the differential second signal to a single-ended output signal.

14. The system of claim 13, wherein the semiconductor device processing system is adapted to form the switching circuit by forming: a plurality of radio frequency (RF) switches comprising a first RF switch configured to provide the first clock phase at a first phase shift and a second RF switch configured to provide the first clock phase at a second phase shift, wherein the first and second phase shift are either 45° apart or 90° apart.

15. The system of claim 14, wherein the semiconductor device processing system is adapted to form the series of frequency multipliers by forming:
   a first frequency multiplier configured to multiply the frequency of the differential modulated signal by two, and a second frequency multiplier configured to further multiply the frequency of the differential modulated signal by two.

16. The system of claim 15, wherein the semiconductor device processing system is adapted to form the modulator by forming:
   at least two RF switches configured to select the first clock phase from among a plurality of phase shifts which are 45° apart.

17. The system of claim 14, wherein the semiconductor device processing system is adapted to form the series of frequency multipliers by forming:
   a first frequency multiplier configured to multiply the frequency of the differential modulated signal by two.

18. The system of claim 17, wherein the semiconductor device processing system is adapted to form the modulator by forming:
   at least two RF switches configured to select the first clock phase from among the plurality of phase shifts which are 90° apart.

* * * * *

UNITED STATES PATENT AND TRADEMARK OFFICE
CERTIFICATE OF CORRECTION

| | | |
|---|---|---|
| PATENT NO. | : 11,675,046 B2 | Page 1 of 1 |
| APPLICATION NO. | : 16/558095 | |
| DATED | : June 13, 2023 | |
| INVENTOR(S) | : See Taur Lee et al. | |

It is certified that error appears in the above-identified patent and that said Letters Patent is hereby corrected as shown below:

On the Title Page

Item (71), Applicant is listed as GLOBALFOUNDRIES INC., however it should read GLOBALFOUNDRIES U.S. Inc.

Signed and Sealed this
Fifteenth Day of October, 2024

Katherine Kelly Vidal
*Director of the United States Patent and Trademark Office*